(12) United States Patent
Welty

(10) Patent No.: US 7,153,586 B2
(45) Date of Patent: Dec. 26, 2006

(54) ARTICLE WITH SCANDIUM COMPOUND DECORATIVE COATING

(75) Inventor: Richard P. Welty, Boulder, CO (US)

(73) Assignee: Vapor Technologies, Inc., Longmont, CO (US)

(*) Notice: Subject to any disclaimer, the term of this patent is extended or adjusted under 35 U.S.C. 154(b) by 278 days.

(21) Appl. No.: 10/633,245

(22) Filed: Aug. 1, 2003

(65) Prior Publication Data

US 2005/0026000 A1 Feb. 3, 2005

(51) Int. Cl.
B32B 15/04 (2006.01)

(52) U.S. Cl. .................. 428/472; 428/469; 428/336; 428/698

(58) Field of Classification Search ............. 428/698, 428/336, 472, 469
See application file for complete search history.

(56) References Cited

U.S. PATENT DOCUMENTS

| | | |
|---|---|---|
| 4,252,856 A | 2/1981 | Sara |
| 4,264,682 A | 4/1981 | Fuyama et al. |
| 4,268,569 A | 5/1981 | Hale |
| 4,269,899 A | 5/1981 | Fuyama et al. |
| 4,273,592 A | 6/1981 | Kelly |
| 4,304,984 A | 12/1981 | Bolotnikov et al. |
| 4,313,769 A | 2/1982 | Frelin et al. |
| 4,338,140 A | 7/1982 | Reghi |
| 4,339,312 A | 7/1982 | Brooks et al. |
| 4,347,083 A | 8/1982 | Sara |
| 4,370,177 A | 1/1983 | Frelin et al. |
| 4,396,458 A | 8/1983 | Platter et al. |
| 4,402,744 A | 9/1983 | Sara |
| 4,419,416 A | 12/1983 | Gupta et al. |
| 4,447,503 A | 5/1984 | Dardi et al. |
| 4,449,989 A | 5/1984 | Sarin et al. |
| 4,545,955 A | 10/1985 | Dickson |
| 4,556,607 A | 12/1985 | Sastri |
| RE32,121 E | 4/1986 | Gupta et al. |
| 4,583,243 A | 4/1986 | Diemer et al. |
| 4,585,481 A | 4/1986 | Gupta et al. |
| 4,594,220 A | 6/1986 | Hasker et al. |
| 4,608,243 A | 8/1986 | Sproul |
| 4,615,865 A | 10/1986 | Duvall et al. |
| 4,698,266 A | 10/1987 | Buljan et al. |
| 4,699,082 A | 10/1987 | Hakim |
| 4,708,037 A | 11/1987 | Buljan et al. |
| 4,731,169 A | 3/1988 | Lipsztajn |
| 4,773,974 A | 9/1988 | Dobosz |

(Continued)

FOREIGN PATENT DOCUMENTS

EP 0032306 B1 7/1981

(Continued)

OTHER PUBLICATIONS

Abstracts for all references submitted, (retrieved from micropat.com on Feb. 24, 2004), 69 pgs.

Primary Examiner—Archene Turner
(74) Attorney, Agent, or Firm—Foley & Lardner LLP

(57) ABSTRACT

An article of manufacture includes a decorative coating that comprises scandium nitride or other scandium-containing compounds such as scandium-alloy nitrides. Scandium nitride coatings have a color very similar to that of pure copper. Scandium-alloy nitrides and other scandium-containing compounds comprising nitrogen, oxygen, and/or carbon can provide a range of colors generally intermediate or between that of scandium nitride and that of the alloying metal compound. The coatings are decorative and can also exhibit advantageous physical characteristics, such as abrasion, wear, chemical, and corrosion resistance.

36 Claims, 1 Drawing Sheet

U.S. PATENT DOCUMENTS

| | | | |
|---|---|---|---|
| 4,773,975 A | 9/1988 | Lipsztajn | |
| 4,780,337 A | 10/1988 | Seyferth et al. | |
| 4,791,017 A | 12/1988 | Hofmann et al. | |
| 4,801,513 A | 1/1989 | Duhl et al. | |
| 4,803,127 A | 2/1989 | Hakim | |
| 4,806,215 A | 2/1989 | Twardowski | |
| 4,829,655 A | 5/1989 | Cornelison et al. | |
| 4,853,096 A | 8/1989 | Lipsztajn et al. | |
| 4,933,239 A | 6/1990 | Olson et al. | |
| 4,965,090 A | 10/1990 | Gärtner et al. | |
| 4,981,512 A | 1/1991 | Kapoor | |
| 5,051,300 A | 9/1991 | Rousseau | |
| 5,064,397 A | 11/1991 | Hasker et al. | |
| 5,065,070 A | 11/1991 | Longo et al. | |
| 5,124,998 A | 6/1992 | Arrigoni et al. | |
| 5,154,970 A | 10/1992 | Kaplan et al. | |
| 5,254,397 A | 10/1993 | Kawai et al. | |
| 5,258,687 A | 11/1993 | Duggan et al. | |
| 5,264,757 A | 11/1993 | Snijkers et al. | |
| 5,283,109 A | 2/1994 | Kaplan et al. | |
| 5,284,685 A | 2/1994 | Rousseau | |
| 5,292,594 A | 3/1994 | Liburdi et al. | |
| 5,314,364 A | 5/1994 | Snijkers et al. | |
| 5,316,866 A | 5/1994 | Goldman et al. | |
| 5,320,675 A | 6/1994 | Dransfield et al. | |
| 5,360,638 A | 11/1994 | Lequertier | |
| 5,394,057 A | 2/1995 | Russell et al. | |
| 5,398,455 A | 3/1995 | Slavin et al. | |
| 5,413,851 A | 5/1995 | Storer | |
| 5,414,748 A | 5/1995 | Upadhya | |
| 5,510,012 A * | 4/1996 | Schulz et al. | 204/192.15 |
| 5,516,421 A | 5/1996 | Brown et al. | |
| 5,534,293 A | 7/1996 | Wisneskie | |
| 5,582,635 A | 12/1996 | Czech et al. | |
| 5,599,385 A | 2/1997 | Czech et al. | |
| 5,686,152 A | 11/1997 | Johnson et al. | |
| 5,702,288 A | 12/1997 | Liebke et al. | |
| 5,708,328 A | 1/1998 | Mathews et al. | |
| 5,815,226 A | 9/1998 | Yamazaki et al. | |
| 5,857,888 A | 1/1999 | Tada et al. | |
| 5,876,793 A | 3/1999 | Sherman et al. | |
| 5,958,268 A | 9/1999 | Engelsberg et al. | |
| 6,007,908 A | 12/1999 | Reece et al. | |
| 6,048,588 A | 4/2000 | Engelsberg | |
| 6,086,726 A | 7/2000 | Renk et al. | |
| 6,118,506 A | 9/2000 | Yamazaki et al. | |
| 6,274,009 B1 | 8/2001 | Krafton et al. | |
| 6,287,644 B1 | 9/2001 | Jackson et al. | |
| 6,301,333 B1 | 10/2001 | Mearini et al. | |
| 6,332,931 B1 | 12/2001 | Das et al. | |
| 6,344,282 B1 | 2/2002 | Darolia et al. | |
| 6,436,473 B1 | 8/2002 | Darolia et al. | |
| 6,447,890 B1 | 9/2002 | Leverenz et al. | |
| 6,458,473 B1 | 10/2002 | Conner et al. | |
| 6,475,355 B1 | 11/2002 | Mearini et al. | |
| 6,498,433 B1 | 12/2002 | Scott et al. | |
| 6,534,903 B1 | 3/2003 | Spiro et al. | |
| 6,538,378 B1 | 3/2003 | Nakano | |
| 6,548,959 B1 | 4/2003 | Harada et al. | |
| 6,563,256 B1 | 5/2003 | Zavadil et al. | |
| 6,580,218 B1 | 6/2003 | Harada et al. | |
| 6,602,356 B1 | 8/2003 | Nagaraj et al. | |
| 6,604,941 B1 | 8/2003 | Billings | |
| 6,612,787 B1 | 9/2003 | North et al. | |
| 6,620,524 B1 | 9/2003 | Pfaendtner et al. | |
| 6,632,762 B1 | 10/2003 | Zaykoski et al. | |
| 6,682,827 B1 | 1/2004 | Darolia et al. | |
| 6,689,199 B1 | 2/2004 | Corderman et al. | |
| 6,689,422 B1 | 2/2004 | Warnes et al. | |
| 2001/0033950 A1 | 10/2001 | Billings | |
| 2002/0009611 A1 | 1/2002 | Darolia et al. | |
| 2002/0027419 A1 | 3/2002 | Harada et al. | |
| 2002/0034639 A1 | 3/2002 | Mearini et al. | |
| 2002/0102403 A1 | 8/2002 | Leverenz et al. | |
| 2002/0114068 A1 | 8/2002 | Kuschnereit et al. | |
| 2002/0132132 A1 | 9/2002 | Bose et al. | |
| 2003/0044633 A1 | 3/2003 | Nagaraj et al. | |
| 2003/0047139 A1 | 3/2003 | Corderman et al. | |
| 2003/0047141 A1 | 3/2003 | Warnes et al. | |
| 2003/0049374 A1 | 3/2003 | Warnes et al. | |
| 2003/0118863 A1 | 6/2003 | Darolia et al. | |
| 2003/0134139 A1 | 7/2003 | Pfaendtner et al. | |
| 2003/0140856 A1 | 7/2003 | Corderman et al. | |
| 2003/0180571 A1 | 9/2003 | Singh | |
| 2004/0016318 A1 | 1/2004 | Angeliu | |

FOREIGN PATENT DOCUMENTS

| | | |
|---|---|---|
| EP | 0047363 B1 | 3/1982 |
| EP | 0082515 B2 | 6/1983 |
| EP | 0107142 B1 | 5/1984 |
| EP | 0117542 B1 | 9/1984 |
| EP | 0121314 B1 | 10/1984 |
| EP | 0127229 B1 | 12/1984 |
| EP | 0179513 B1 | 4/1986 |
| EP | 0236961 B1 | 9/1987 |
| EP | 0266127 B1 | 5/1988 |
| EP | 0266128 A2 | 5/1988 |
| EP | 0266129 A2 | 5/1988 |
| EP | 0267704 A1 | 5/1988 |
| EP | 0283910 A2 | 9/1988 |
| EP | 0321087 A1 | 6/1989 |
| EP | 0328818 B1 | 8/1989 |
| EP | 0353367 B1 | 2/1990 |
| EP | 0386386 B1 | 9/1990 |
| EP | 0390269 B1 | 10/1990 |
| EP | 0428206 A1 | 5/1991 |
| EP | 0428206 B1 | 5/1991 |
| EP | 0435039 B1 | 7/1991 |
| EP | 0492763 A1 | 7/1992 |
| EP | 0519643 B1 | 12/1992 |
| EP | 0532150 A1 | 3/1993 |
| EP | 0535796 B1 | 4/1993 |
| EP | 0564709 B1 | 10/1993 |
| EP | 0581423 A1 | 2/1994 |
| EP | 0583122 A1 | 2/1994 |
| EP | 0604096 B1 | 6/1994 |
| EP | 0723573 B1 | 7/1996 |
| EP | 0761386 B1 | 3/1997 |
| EP | 0780564 A2 | 6/1997 |
| EP | 0798572 A1 | 10/1997 |
| EP | 0821078 B1 | 1/1998 |
| EP | 0834191 B1 | 4/1998 |
| EP | 1008672 A1 | 6/2000 |
| EP | 1061553 A1 | 12/2000 |
| EP | 1067580 B1 | 1/2001 |
| EP | 1111091 A1 | 6/2001 |
| EP | 1197577 A2 | 4/2002 |
| EP | 1197583 A1 | 4/2002 |
| EP | 1209247 A1 | 5/2002 |
| EP | 1314790 A2 | 5/2003 |
| EP | 1321541 A2 | 6/2003 |
| EP | 1329536 A1 | 7/2003 |
| JP | 03-166328 * | 7/1991 |
| JP | 03-188232 * | 8/1991 |
| JP | 03-188233 * | 8/1991 |

* cited by examiner

ARTICLE WITH SCANDIUM COMPOUND DECORATIVE COATING

FIELD OF THE INVENTION

The present invention relates to articles having a coating deposited thereon. More particularly, the present invention relates to articles having compound decorative coatings which include scandium.

BACKGROUND OF THE INVENTION

Decorative and protective coatings deposited by physical vapor deposition (PVD) have in recent years become important in the fields of plumbing hardware and accessories, home hardware such as doorknobs and hinges, automotive parts, and many other applications. The most commercially successful of these coatings have been those possessing a brass or gold color, which coatings generally consist of the nitrides of metals or metal alloys such as zirconium nitride, titanium nitride, and zirconium-titanium nitride. It is known to produce coatings with colors similar to those of pure copper and copper alloys (e.g. bronze) by using the carbonitrides of such metals and alloys rather than simple nitride compounds. It is difficult, however, using these materials, to produce a coating having a color closely matching that of pure copper.

Another problem with known carbonitride coatings is that their resistance to common household chemicals and to salt-spray testing is generally inferior to that of simple nitride PVD coatings. As a result, carbonitride coatings tend to tarnish more readily in service.

Yet another problem with carbonitride coatings concerns the stability and repeatability of coating deposition processes, which are adversely affected by the carbon-containing gases used to form the carbonitride compounds.

Accordingly, it would be desirable to provide vapor deposited coatings which have a color very similar to that of pure copper or other desirable metal coatings, but which have substantially better resistance to chemicals and tarnishing than copper itself and also to conventional metal carbonitrides. It would further be desirable to provide coatings having a controllable range of colors similar to those of copper and copper alloys such as bronze, and also to other colors such as, for example, pinkish and reddish shades of brass, gold, chrome, gray. It would also be desirable to provide a coating method which is stable and repeatable and which does not necessitate excessive equipment maintenance.

It would be desirable to provide a coating and/or method that provides one or more of these or other advantageous features. Other features and advantages will be made apparent from the present specification. The teachings disclosed extend to those embodiments which fall within the scope of the appended claims, regardless of whether they accomplish one or more of the above-mentioned needs.

SUMMARY OF THE INVENTION

The present invention is directed to an article having a decorative coating provided thereon and a method of preparing such an article. The article may include a substrate made of a metallic, plastic, ceramic, or composite material. The coating is a compound including scandium, and may be provided over at least a portion of one or more surfaces of the article. According to a most preferred embodiment, the coating is scandium nitride, which is a hard ceramic material with properties similar to the nitrides of other elements in its region of the periodic table, such as titanium and zirconium. The coating is decorative and hard, and also provides scratch resistance, wear resistance, chemical resistance, and tarnish resistance.

The term "scandium-containing compound" refers herein most preferably to scandium nitride, and also refers preferably to scandium-alloy nitrides in which scandium is alloyed with one or more other metals such as zirconium, titanium, yttrium, niobium, hafnium, molybdenum, chromium, or lanthanum. The term scandium-containing compound also refers to the family of compounds of the form $Sc_aM_bO_xC_yN_z$ in which the terms a and b specify the relative amounts of scandium and an (optional) alloying metal "M", and in which the terms x, y, and z specify the relative amounts of oxygen, carbon, and nitrogen. The coating in the most preferred scandium nitride embodiment has a color very similar to that of natural copper, but also exhibits other properties that are superior to those of copper, which is a soft and corrosion-prone metal. In other embodiments, the coating can have a wide range of other colors depending on the specific composition of the scandium-containing compound.

The term "decorative coating" refers to coatings that provide a desired surface appearance to an article, and in particular to coatings that have a desired color. According to certain embodiments, in addition to providing a desired surface appearance, the decorative coating may also provide various utilitarian features such as some degree of abrasion, scratch, tarnish, and/or corrosion resistance to an underlying substrate. The term "decorative coating" is also used herein to refer to coatings employed for other functional purposes (e.g., to increase the strength of a cutting edge or improve the wear resistance of a surface), for other applications (e.g., semiconductor and/or optoelectronic applications), and/or for use in applications in which the appearance of the coating contributes to marketing appeal. Various nonexclusive examples of applications for such coatings include, for example, knives, medical instruments, tableware, and sporting goods such as golf clubs.

In other embodiments, the coating may be made from other materials that have similar chemical properties to provide a coating exhibiting a particular decorative characteristic. Such other embodiments include coatings which comprise yttrium nitride, lanthanum nitride, neodymium nitride, praseodymium nitride, samarium nitride, dysprosium nitride, erbium nitride, ytterbium nitride, cerium nitrite, other metal nitrides from the lanthanide series of the periodic table (elements 58–71), and other compounds containing the constituent metals and alloys thereof (as well as nitrogen, oxygen and/or carbon). These other embodiments provide a range of attractive colors and possess properties similar to chemically-related nitrides and other compounds, making them suitable for decorative coating applications such as those described above.

A particular exemplary embodiment relates to an article having a decorative coating provided thereon. The article includes a substrate having a surface and a material comprising scandium provided over at least a portion of the surface to thereby form a decorative coating which exhibits a desired color.

Another exemplary embodiment relates to an article having a decorative coating. The article includes a substrate having a surface and a compound provided over at least a portion of the surface. The compound comprises scandium.

A further exemplary embodiment relates to a method for manufacturing a decoratively coated article. The method includes providing a substrate having a surface and depositing a compound on at least a portion of the surface. The compound comprises scandium.

Additional preferred and exemplary embodiments relate to other features and combinations of features as may be generally recited in the claims and in the disclosure provided herein.

DETAILED DESCRIPTION OF THE PREFERRED AND EXEMPLARY EMBODIMENTS

Figure 1:
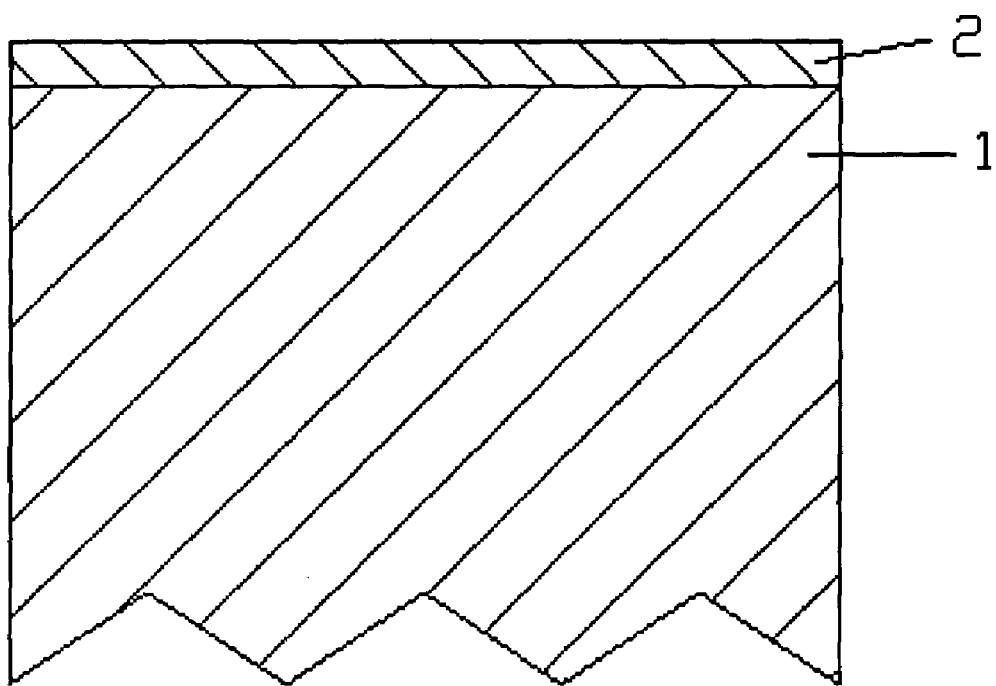
FIG. 1 is a schematic cross-sectional view showing a section of a substrate upon which is deposited a scandium-containing compound coating.

Referring to FIG. 1, a substrate or base layer 1 is provided as a portion of an article of manufacture. The substrate 1 may be provided as a portion of any of a variety of articles of manufacture, including, for example, without limitation, plumbing hardware and accessories, appliances, home hardware (e.g., doorknobs, hinges, and handles), automotive parts, knives, medical instruments, tableware, semiconductor and optoelectronic devices, and various other consumer and industrial products for which a decorative coating may be desirable.

The substrate 1 can be any metal, ceramic, plastic, composite, or other material capable of withstanding the processing conditions described herein. Illustrative of metal and metal alloy substrates are copper, steel, brass, zinc, and the like. The substrate 1 can also include electroplated layers or polymer base coats used to level and/or seal the substrate surface. Electroplated layers and polymer base coats are well known in the field of vacuum coating technology, and can be applied by various conventional techniques using known materials.

A material comprising scandium such as a scandium-containing compound layer 2 is provided (e.g., deposited) on the surface of the substrate 1. The layer 2 provides a desired color for the substrate 1, and can also serve to improve the abrasion, wear, tarnish, and/or corrosion resistance of the substrate in certain exemplary embodiments.

The term "scandium-containing compound" as used herein refers most preferably to scandium nitride, and also refers preferably to scandium-alloy nitrides in which scandium is alloyed with one or more additional metals. According to various exemplary embodiments, scandium-alloy nitrides may include alloy metals such as refractory metals (e.g., niobium, molybdenum), rare earth metals in the lanthanide series of the periodic table (e.g., elements 57–71), or various transition metals (e.g., zirconium, titanium, yttrium, hafnium, chromium, aluminum). The term scandium-containing compound also refers to the family of compounds of the form $Sc_aM_bO_xC_yN_z$, in which the terms a and b specify the relative atomic amounts of scandium and an optional alloying metal "M". The terms x, y, and z specify the relative atomic amounts of oxygen, carbon, and nitrogen in the compound.

Scandium-containing compounds can be used to provide coatings having a range of colors. For example, scandium nitride (ScN) itself has a color very similar to that of pure copper, both "to the eye" and according to calorimetric measurements. The nitrides of alloys of scandium with zirconium, titanium, and chromium, for example, have colors intermediate or between the copper-like color of ScN and the brass-like, gold-like, and grayish colors of zirconium nitride (ZrN), titanium nitride (TiN), and chromium nitride (CrN), respectively, depending on the composition of the alloy. Similarly, the nitrides of alloys of scandium with other metals have colors intermediate or between that of ScN and the nitride of the individual alloying metal. Reddish or pinkish brass, gold, and "chrome" colors can be produced by experimentally adjusting the alloy percentages a and b in the above formula. Measurable color shifts can be observed when scandium levels as low as a few atomic percent are added to various compounds. However, in a most preferred embodiment, at least around 10 atomic percent of scandium is provided to achieve a desired color.

According to a preferred embodiment, the layer 2 is a simple nitride coating ($x=y=0$ and $z=1$ in the above formula). In addition to providing a desirable decorative color for an article, it is believed that simple nitride coatings also exhibit improved chemical, corrosion, tarnish, and/or abrasion resistance as compared to coatings containing carbon.

An additional range of colors may be produced by adding carbon and/or oxygen to a scandium-containing compound in addition to, or in place of, nitrogen. With increasing carbon content, for example, scandium carbonitride shifts from a deep copper color to bronze to increasingly darker and more reddish shades. Increasing carbon content tends to lead to a deterioration in performance, however, as noted earlier for prior art materials. With increasing oxygen content, scandium carbo-oxy-nitride shifts from a light copper color to an increasingly darker gray color.

A range of colors increasingly similar to that of scandium metal can be obtained by reducing the nitrogen content of a scandium nitride coating below its stoichiometric ratio of 1:1 (ScN).

A range of colors becoming increasingly blue and then purplish can be obtained by increasing the nitrogen content of a scandium nitride coating above its stoichiometric ratio. Such over-nitriding is difficult to accomplish using cathodic arc evaporation (CAE) due to the high energy of the coating atoms arriving at the substrate surface, but over-nitriding can be accomplished using sputtering by operating at a slightly higher nitrogen pressure during deposition than that required to obtain the stoichiometric coating.

A range of colors becoming increasingly dark gray or black can be obtained by increasing the fraction of aluminum in a scandium-aluminum alloy nitride coating.

Color variations can be obtained in the families of yttrium-containing and lanthanide-containing (e.g., rare earth elements 57–71) compounds by applying the alloying and compositional variation methods discussed above, based on similarities in the various physical and chemical properties of these materials.

The layer 2 can be deposited by physical vapor deposition (PVD) methods such as sputtering and cathodic arc evaporation (CAE) or by chemical vapor deposition (CVD) methods such as plasma-assisted CVD (PACVD) and metallo-organic CVD (MOCVD). These techniques are conventional and well-known in the art. Preferred methods of deposition for the layer 2 are CAE and sputtering, both of which are carried out in a reactive gas atmosphere in a vacuum chamber equipped with pumping, gas control, and cathode power supply means. The coating can be deposited using known techniques and process parameter ranges for reactive deposition of nitride materials (such as titanium nitride) which are currently in widespread industrial use. Cathodic arc evaporation (CAE) or sputtering may be carried out using a scandium metal cathode or using an alloy cathode comprising scandium and one or more other metals.

Scandium-containing compounds can also be deposited by simultaneous operation of two or more CAE or sputtering cathodes, one of which is scandium or a scandium alloy and the other(s) of which is another metal such as zirconium, titanium, yttrium, niobium, hafnium, molybdenum, chromium, aluminum, lanthanum, neodymium, praseodymium, samarium, dysprosium, erbium, ytterbium, cerium, or another metal from the rare earth or lanthanide series of the periodic table (elements 57–71) and alloys thereof. Similar known methods can be used to deposit coatings of yttrium nitride, lanthanum nitride, neodymium nitride, praseodymium nitride, samarium nitride, dysprosium nitride, erbium nitride, ytterbium nitride, cerium nitride, and other metal nitrides including metals from the rare earth or lanthanide series of the periodic table (elements 57–71), and other compounds containing the constituent metals and alloys thereof (as well as nitrogen, oxygen and/or carbon). Such co-deposited alloy coatings may also be deposited using a combination of CAE and sputtering cathodes.

The layer 2 has a thickness at least effective to provide a desired color. According to an exemplary embodiment, the layer 2 has a thickness of greater than approximately 50 nm, and preferably greater than approximately 100 nm. Increasing the coating thickness may increase the protection provided to the substrate against abrasion, wear, corrosion, and other damage in certain embodiments. For routine decorative applications in which the coated article is subjected to moderate service conditions, such as for faucets, doorknobs, and the like, the thickness of the layer 2 is preferably greater than approximately 250 nm, and more preferably approximately 500 nm. For cutting tools and other applications in which the coated article is subjected to more severe conditions, the thickness of the layer 2 is preferably greater than approximately 1 micron, and more preferably between approximately 3 and 5 microns. Even greater thicknesses for the layer 2 (e.g., between approximately 5 and 20 microns) may be used for more demanding applications. However, internal stresses in the coating increase with increasing thickness, and may cause loss of adhesion between the coating and the substrate.

The adhesion between the layer 2 and the substrate 1 can generally be improved by the deposition of a strike layer onto the substrate 1 prior to the deposition of the layer 2. Strike layers are commonly used to improve adhesion in vacuum coating processes, and generally have a thickness of between approximately 10 nm and 50 nm. According to a preferred embodiment, the strike layer comprises scandium. According to other exemplary embodiments, any suitable material may be used for the strike layer, including chromium, titanium, zirconium, or other materials which provide improved adhesion between the layer 2 and the substrate 1.

Other embodiments of the invention can include a thin scandium oxide or scandium oxy-nitride layer deposited on top of the layer 2 and/or a multilayer-stack layer comprising multiple alternating scandium and scandium nitride layers to improve chemical resistance. The sandwich layer may comprise between around 10 and 50 layers, with total thickness preferably from about 100 to 500 nm. Such thin top layers and multi-layer stack layers are described in numerous decorative coating patents involving such materials as zirconium nitride and having the same assignee as the present application. A scandium oxide layer having thickness from a few hundred to a few thousand angstroms can also be deposited below the scandium nitride layer to improve corrosion resistance, singly or in combination with either or both of a multi-layer stack and a thin oxy-nitride or oxide top layer. Scandium oxy-nitride is understood herein to refer to a transparent coating comprising the reaction products of scandium, oxygen, and nitrogen.

In order that the invention may be more readily understood, the following nonexclusive examples are provided. The examples are therefore intended to be illustrative and not limiting. Further embodiments will be apparent to those skilled in the art, and such embodiments are intended to be included within the scope of the present disclosure.

EXAMPLE 1

Clean brass substrates electroplated with duplex nickel and chromium layers are placed in a vacuum chamber equipped with a CAE cathode comprising a scandium metal evaporable element. The chamber is evacuated to a pressure below $2 \times 10e-5$ Torr, and the substrates are subjected to an argon glow discharge cleaning step using known parameters. A mixed argon and nitrogen atmosphere is then established in the chamber, and an arc discharge is initiated and maintained on the cathode by known means. The substrate is exposed to the metal plasma emitted by the cathode for a period of time sufficient to deposit the required coating thickness. Gas pressures and flow rates and other routine process variables can be optimized to achieve the desired coating color by one or ordinary skill in the art, using methods widely known in the field of decorative coating deposition. A copper-colored scandium nitride decorative coating can thereby be deposited on the substrate.

EXAMPLE 2

Clean brass substrates electroplated with duplex nickel and chromium layers are placed in a vacuum chamber equipped with 2 sputtering cathodes, comprising scandium and zirconium evaporable elements. The cathodes are arranged such that both scandium and zirconium are deposited simultaneously on the substrate, in a ratio determined by the relative amounts of electrical power provided to the 2 sputtering discharges. The chamber is evacuated to a pressure below $2 \times 10e-5$ Torr, and the substrates are subjected to an argon glow discharge cleaning step using known parameters. A mixed argon and nitrogen atmosphere is then established in the chamber, and a sputtering discharge is initiated and maintained on both cathodes by known means. The substrate is exposed to the atomic flux emitted by the cathodes for a period of time sufficient to deposit the required coating thickness. The nitrogen partial pressure during deposition can preferably be controlled using closed-loop feedback from, e.g., an optical, voltage, or gas composition sensor. Gas pressures and flow rates and other routine process variables can be optimized to achieve the desired coating color by one or ordinary skill in the art, using commercially well-known methods. Decorative coatings having a range of colors varying from the copper color of scandium nitride to the brass color of zirconium nitride can thereby be deposited on the substrate by varying the power applied to the scandium and zirconium sputtering cathodes.

EXAMPLE 3

Clean plastic substrates electroplated with copper, duplex nickel and chromium layers are placed in a vacuum chamber equipped with a CAE cathode comprising a scandium-titanium alloy evaporable element. The chamber is evacuated to a pressure below $2 \times 10e-5$ Torr, and the substrates are subjected to an argon glow discharge cleaning step using known parameters. A mixed argon and nitrogen atmosphere is then established in the chamber, and an arc discharge is initiated and maintained on the cathode by known means. The substrate is exposed to the metal plasma emitted by the cathode for a period of time sufficient to deposit the required coating thickness. Gas pressures and flow rates and other routine process variables can be optimized to achieve the desired coating color by one or ordinary skill in the art, using methods widely known in the field of decorative coating deposition. Decorative coatings having a range of colors varying from the copper color of scandium nitride to the golden color of titanium nitride can thereby be deposited on the substrate by varying the ratio of scandium to titanium in the alloy evaporable element.

EXAMPLE 4

Clean metal substrates electroplated with duplex nickel and chromium layers are placed in a vacuum chamber equipped with a CAE cathode comprising a scandium-zirconium alloy evaporable element. The chamber is evacuated to a pressure below 2×10e−5 Torr, and the substrates are subjected to an argon glow discharge cleaning step using known parameters. An argon atmosphere is then established in the chamber, and an arc discharge is initiated and maintained on the cathode by known means. The substrate is exposed to the metal plasma emitted by the cathode for a period of time sufficient to deposit a scandium-zirconium alloy strike layer having the desired thickness. A mixed argon and nitrogen atmosphere is then established in the chamber, and an arc discharge is initiated and maintained on the cathode by known means. The substrate is exposed to the metal plasma emitted by the cathode for a period of time sufficient to deposit the required thickness of scandium-zirconium nitride. A mixed argon, oxygen, and nitrogen atmosphere is then established in the chamber, and an arc discharge is initiated and maintained on the cathode by known means. The substrate is exposed to the metal plasma emitted by the cathode for a period of time sufficient to deposit a thin scandium-zirconium oxy-nitride top layer having the desired thickness. Gas pressures and flow rates and other routine process variables can be optimized to achieve the desired coating color by one or ordinary skill in the art, using methods widely known in the field of decorative coating deposition. Decorative coatings having a range of colors varying from the copper color of scandium nitride to the brass color of zirconium nitride can thereby be deposited on the substrate by varying the ratio of scandium to zirconium in the alloy evaporable element.

EXAMPLE 5

Clean metal substrates electroplated with duplex nickel and chromium layers are placed in a vacuum chamber equipped with a CAE cathode comprising a scandium metal evaporable element. The chamber is evacuated to a pressure below 2×10e−5 Torr, and the substrates are subjected to an argon glow discharge cleaning step using known parameters. An argon atmosphere is then established in the chamber, and an arc discharge is initiated and maintained on the cathode by known means. The substrate is exposed to the metal plasma emitted by the cathode for a period of time sufficient to deposit a scandium strike layer having the desired thickness. A mixed argon and oxygen atmosphere is then established in the chamber, and an arc discharge is initiated and maintained on the cathode by known means. The substrate is exposed to the metal plasma emitted by the cathode for a period of time sufficient to deposit a scandium oxide corrosion barrier layer of the desired thickness. A mixed argon and nitrogen atmosphere is then established in the chamber, and an arc discharge is initiated and maintained on the cathode by known means. The substrate is exposed to the metal plasma emitted by the cathode for a period of time sufficient to deposit a layer of scandium-zirconium nitride of the desired thickness. A mixed argon, oxygen, and nitrogen atmosphere is then established in the chamber, and an arc discharge is initiated and maintained on the cathode by known means. The substrate is exposed to the metal plasma emitted by the cathode for a period of time sufficient to deposit a thin scandium-zirconium oxy-nitride top layer having the desired thickness. Gas pressures and flow rates and other routine process variables can be optimized to achieve the desired coating color by one or ordinary skill in the art, using methods widely known in the field of decorative coating deposition. Decorative coatings having a range of colors varying from the copper color of scandium nitride to the brass color of zirconium nitride can thereby be deposited on the substrate by varying the ratio of scandium to zirconium in the alloy evaporable element.

EXAMPLE 6

Clean brass substrates coated with a polymer corrosion-protection layer are placed in a vacuum chamber equipped with a CAE cathode comprising a scandium metal evaporable element. The chamber is evacuated to a pressure below 2×10e−5 Torr, and the substrates are subjected to an argon glow discharge cleaning step using known parameters. An argon atmosphere is then established in the chamber, and an arc discharge is initiated and maintained on the cathode by known means. The substrate is exposed to the metal plasma emitted by the cathode for a period of time sufficient to deposit a scandium metal strike layer having the desired thickness. A mixed argon and nitrogen atmosphere is then established in the chamber, and an arc discharge is initiated and maintained on the cathode by known means. The substrate is exposed to the metal plasma emitted by the cathode for a period of time sufficient to deposit the required scandium nitride coating thickness. A mixed argon, oxygen, and nitrogen atmosphere is then established in the chamber, and an arc discharge is initiated and maintained on the cathode by known means. The substrate is exposed to the metal plasma emitted by the cathode for a period of time sufficient to deposit a thin scandium oxy-nitride top layer having the desired thickness. Gas pressures and flow rates and other routine process variables can be optimized to achieve the desired coating color by one or ordinary skill in the art, using methods widely known in the field of decorative coating deposition. A copper-colored scandium nitride decorative coating can thereby be deposited on the substrate.

Although the present invention has been described with reference to certain exemplary embodiments, those skilled in the art who review this disclosure will readily appreciate that many modifications are possible (e.g., variations in sizes, dimensions, structures, shapes and proportions of the various elements, values of parameters, mounting arrangements, use of materials, orientations, etc.) without materially departing from the novel teachings and advantages of the subject matter recited in the claims. Accordingly, all such modifications are intended to be included within the scope of the present invention as defined in the appended claims. Although certain embodiments may have been described as including one or more features providing one or more benefits, it is contemplated that the described features may be interchanged with one another or alternatively be combined with one another in the described preferred embodiments or in other alternative embodiments. Unless specifically otherwise noted, the claims reciting a single particular element also encompass a plurality of such particular elements. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the preferred and other exemplary embodiments without departing from the scope of the present inventions as expressed in the appended claims.

What is claimed is:

1. An article having a decorative coating provided thereon, the article comprising:
    substrate having a surface; and
    a material provided over at least a portion of the surface to thereby form a decorative coating which exhibits a desired color;
    wherein the material consists essentially of pure scandium or scandium alloyed with one or more elements selected from the group consisting of oxygen, nitrogen, carbon, refractory metals, rare earth metals in the lanthanide series of the periodic table, transition metals, and combinations thereof.

2. The article of claim 1, wherein the material comprises nitrogen.

3. An article having a decorative coating provided thereon, the article comprising:
    a substrate having a surface; and
    a material comprising scandium provided over at least a portion of the surface to thereby form a decorative coating which exhibits a desired color;
    wherein the material comprising scandium further comprises at least one of carbon and oxygen.

4. The article of claim 1, wherein the material comprises at least 10 atomic percent scandium.

5. The article of claim 1, wherein the material includes at least one metal selected from the group consisting of zirconium, titanium, yttrium, niobium, hafnium, molybdenum, chromium, and aluminum.

6. The article of claim 5, wherein the material includes nitrogen.

7. The article of claim 5, wherein the material includes at least one of carbon and oxygen.

8. The article of claim 1, wherein the material includes at least one metal selected from the group consisting of lanthanum, neodymium, praseodymium, samarium, dysprosium, erbium, ytterbium, and cerium.

9. The article of claim 8, wherein the material includes nitrogen.

10. The article of claim 8, wherein the material includes at least one of carbon and oxygen.

11. The article of claim 1, wherein the material is configured to provide at least one of abrasion resistance, scratch resistance, tarnish resistance, and corrosion resistance for the substrate.

12. The article of claim 1, wherein the material has a thickness effective to provide the desired color.

13. The article of claim 12, wherein the thickness is greater than approximately 50 nm.

14. The article of claim 13, wherein the thickness is greater than approximately 100 nm.

15. An article having a decorative coating provided thereon, the article comprising:
    a substrate having a surface; and
    a material comprising scandium provided over at least a portion of the surface to thereby form a decorative coating which exhibits a desired color;
    further comprising a strike layer provided intermediate the substrate and the material comprising scandium.

16. The article of claim 15, wherein the strike layer comprises scandium.

17. An article having a decorative coating comprising:
    a substrate having a surface; and
    a compound provided over at least a portion of the surface, the compound consisting essentially of scandium and one or more materials selected from the group consisting of oxygen, nitrogen, carbon, zirconium, titanium, yttrium, niobium, hafnium, molybdenum, chromium, aluminum, lanthanum, neodymium, praseodymium, samarium, dysprosium, erbium, ytterbium, and cerium.

18. The article of claim 17, wherein the compound comprises scandium nitride.

19. The article of claim 17, wherein the compound further comprises at least one of carbon and oxygen.

20. The article of claim 17, wherein the compound includes at least one metal selected from the group consisting of zirconium, titanium, yttrium, niobium, hafnium, molybdenum, chromium, aluminum, lanthanum, neodymium, praseodymium, samarium, dysprosium, erbium, ytterbium, and cerium.

21. The article of claim 20, wherein the compound includes nitrogen.

22. The article of claim 17, wherein the compound includes at least one of carbon and oxygen.

23. The article of claim 17, wherein the compound is configured to provide at least one of abrasion resistance, scratch resistance, tarnish resistance, and corrosion resistance for the substrate.

24. The article of claim 17, wherein the compound has a thickness greater than approximately 50 nm.

25. The article of claim 24, wherein the compound has a thickness greater than approximately 100 nm.

26. An article of manufacture comprising:
    a substrate having a surface; and
    a compound consisting essentially of scandium and at least one additional element deposited on the surface, the compound configured to provide a decorative color coating for the article;
    wherein the at least one additional element is selected from the group consisting of nitrogen, oxygen, carbon, zirconium, titanium, yttrium, niobium, hafnium, molybdenum, chromium, aluminum, lanthanum, neodymium, praseodymium, samarium, dysprosium, erbium, ytterbium, and cerium;
    wherein the color provided by the compound may be adjusted by changing the amount of the at least one additional element in the compound.

27. The article of claim 26, wherein the compound includes at least two elements selected from the group consisting of nitrogen, oxygen, carbon, and a metal.

28. The article of claim 27, wherein the color provided by the compound may be adjusted by changing the relative amounts of the at least two additional elements.

29. The article of claim 26, wherein the compound comprises scandium and nitrogen.

30. The article of claim 29, wherein the compound further comprises at least one of oxygen, carbon, and a metal.

31. The article of claim 26, wherein the compound comprises a metal selected from the group consisting of zirconium, titanium, yttrium, niobium, hafnium, molybdenum, chromium, and aluminum.

32. The article of claim 31, wherein the compound further comprises nitrogen.

33. The article of claim 26, wherein the compound comprises a metal selected from the group consisting of lanthanum, neodymium, praseodymium, samarium, dysprosium, erbium, ytterbium, and cerium.

34. The article of claim 33, wherein the compound further comprises nitrogen.

35. The article of claim 26, further comprising a strike layer provided intermediate the compound and the substrate, the strike layer comprising scandium.

36. The article of claim 26, wherein the compound is deposited at a thickness greater than 50 nm.

* * * * *

UNITED STATES PATENT AND TRADEMARK OFFICE
CERTIFICATE OF CORRECTION

| | | |
|---|---|---|
| PATENT NO. | : 7,153,586 B2 | Page 1 of 1 |
| APPLICATION NO. | : 10/633245 | |
| DATED | : December 26, 2006 | |
| INVENTOR(S) | : Richard P. Welty | |

It is certified that error appears in the above-identified patent and that said Letters Patent is hereby corrected as shown below:

Column 9:
line 19, before "substrate" insert --a--.

Signed and Sealed this

Eighteenth Day of March, 2008

JON W. DUDAS
*Director of the United States Patent and Trademark Office*